United States Patent
Radic (10) Patent No.: US 10,700,613 B2
(45) Date of Patent: Jun. 30, 2020

(54) QUASI-RESONANT FLYBACK CONVERTER CONTROLLER

(71) Applicant: Silanna Asia Pte Ltd, Singapore (SG)

(72) Inventor: Aleksandar Radic, Toronto (CA)

(73) Assignee: Silanna Asia Pte Ltd, Singapore (SG)

( * ) Notice: Subject to any disclaimer, the term of this patent is extended or adjusted under 35 U.S.C. 154(b) by 0 days.

(21) Appl. No.: 16/530,900

(22) Filed: Aug. 2, 2019

(65) Prior Publication Data
US 2019/0356231 A1 Nov. 21, 2019

Related U.S. Application Data

(63) Continuation of application No. PCT/IB2019/050954, filed on Feb. 6, 2019.
(Continued)

(51) Int. Cl.
*H02M 3/335* (2006.01)
*H02M 1/00* (2006.01)
(Continued)

(52) U.S. Cl.
CPC ... *H02M 3/33576* (2013.01); *H02M 3/33507* (2013.01); *H03M 1/12* (2013.01);
(Continued)

(58) Field of Classification Search
CPC . H02M 2001/0009; H02M 2001/0016; H02M 2001/0058; H02M 1/08; H02M 1/36; H02M 7/12
See application file for complete search history.

(56) References Cited

U.S. PATENT DOCUMENTS

| 9,991,811 B1 | 6/2018 | Song et al. |
| 2008/0130324 A1 | 6/2008 | Choi et al. |

(Continued)

FOREIGN PATENT DOCUMENTS

| JP | 08228478 | 9/1996 |
| KR | 20110098000 A | 8/2011 |
| KR | 20170037745 A | 4/2017 |

OTHER PUBLICATIONS

Park et al., "Quasi-Resonant (QR) Controller with Adaptive Switching Frequency Reduction Scheme for Flyback Converter", Jun. 2016, IEEE Transactions on Industrial Electronics, vol. 63 No. 6, pp. 3571-3580. (Year: 2016).*

(Continued)

*Primary Examiner* — Nguyen Tran
*Assistant Examiner* — David A. Singh
(74) *Attorney, Agent, or Firm* — MLO, a professional corp.

(57) ABSTRACT

A flyback converter includes a primary-side circuit to receive an input voltage, a secondary-side circuit to generate an output voltage, a transformer coupling the primary-side circuit to the secondary-side circuit, a main switch coupled to a primary winding of the transformer, and a converter controller having a primary-side controller in signal communication with the main switch to control an on time and an off time of the main switch and to detect one or more valleys of a resonant waveform developed at the main switch during the off time of the main switch. The primary-side controller is configured to operate in a valley reduction mode of operation upon determining that the output voltage is less than a reference voltage minus a predetermined threshold value. The valley reduction mode of operation includes decrementing, for each switching cycle of the main (Continued)

switch, a number of valleys occurring during that switching cycle.

20 Claims, 5 Drawing Sheets

Related U.S. Application Data

(60) Provisional application No. 62/629,351, filed on Feb. 12, 2018.

(51) Int. Cl.
    *H02M 1/36*     (2007.01)
    *H02M 7/12*     (2006.01)
    *H03M 1/12*     (2006.01)
    *H02M 1/08*     (2006.01)

(52) U.S. Cl.
    CPC ............... *H02M 1/08* (2013.01); *H02M 1/36* (2013.01); *H02M 7/12* (2013.01); *H02M 2001/0009* (2013.01); *H02M 2001/0016* (2013.01); *H02M 2001/0058* (2013.01)

(56) References Cited

U.S. PATENT DOCUMENTS

| | | | | |
|---|---|---|---|---|
| 2009/0086513 | A1* | 4/2009 | Lombardo | H02M 3/33507 363/21.12 |
| 2013/0235623 | A1 | 9/2013 | Huang | |
| 2014/0078790 | A1* | 3/2014 | Lin | H02M 3/33507 363/21.16 |
| 2014/0131843 | A1 | 5/2014 | Balakrishnan et al. | |
| 2015/0244272 | A1 | 8/2015 | Schaemann et al. | |
| 2015/0311810 | A1* | 10/2015 | Chen | H02M 3/33523 363/21.13 |
| 2017/0012538 | A1* | 1/2017 | Barrenscheen | H02M 3/33507 |
| 2017/0054374 | A1* | 2/2017 | Fang | H02M 3/33523 |
| 2018/0019677 | A1* | 1/2018 | Chung | H02M 3/155 |
| 2018/0076721 | A1* | 3/2018 | Cannenterre | H02M 3/33523 |
| 2018/0337607 | A1* | 11/2018 | Drda | H02M 3/33507 |
| 2018/0351464 | A1* | 12/2018 | Finkel | H02M 3/33507 |
| 2019/0006935 | A1* | 1/2019 | Wang | H02M 3/33507 |
| 2019/0199222 | A1* | 6/2019 | Lin | H02M 3/33507 |
| 2019/0252966 | A1* | 8/2019 | Radic | H02M 3/33507 |
| 2019/0252985 | A1* | 8/2019 | Radic | H02M 3/33515 |

OTHER PUBLICATIONS

FAN108M6X, "Offline Primary-Side-Regulation (PSR) Quasi-Resonant Valley Switch Controller," ON Semiconductor, www.onsemi.com, Sep. 2018, pp. 1-21.

International Search Report dated May 15, 2019 for PCT Patent Application No. PCT/IB2019/050954.

* cited by examiner

FIG. 5 ical interference (EMI).
QUASI-RESONANT FLYBACK CONVERTER CONTROLLER

RELATED APPLICATIONS

This application is a continuation of International Application No. PCT/IB2019/050954, filed Feb. 6, 2019, which claims priority to U.S. Provisional Patent Application No. 62/629,351, filed on Feb. 12, 2018, and titled "Flyback Transient Controller," all of which are hereby incorporated by reference in their entirety.

BACKGROUND

Switch-mode power supplies (SMPSs) ("power converters") are widely utilized in consumer, industrial and medical applications to provide well-regulated power while maintaining high power processing efficiency, tight-output voltage regulation, and reduced conducted and radiated electromagnetic interference (EMI).

To meet these conflicting goals, state-of-the-art power converters (flyback converters, forward converters, boost converters, buck converters, and so on) commonly utilize quasi-resonant control methods. Quasi-resonant control methods induce a resonant waveform having sinusoidal voltage oscillations at the drains of one or more semiconductor switches of the power converter. Through well-timed control actions, the semiconductor switches are turned on at the instants where the drain voltage is minimum (i.e., valley switching), thus minimizing the semiconductor switching losses and drain-source dv/dt slope, leading to increased power processing efficiency and reduced electromagnetic interference (EMI).

In some instances, a typical flyback converter may have a slow dynamic response during output load transients and output voltage reference changes. In order to compensate for this slow dynamic response and ensure tight output voltage regulation during load transients, an oversized output capacitor is typically needed, contributing to increased flyback converter cost and volume. Unfortunately, the larger output capacitor capacitance increases the output voltage rise time during output voltage reference changes, potentially affecting output voltage step transition-time compliance in programmable output voltage applications.

SUMMARY

Some embodiments described herein provide a flyback converter that includes a primary-side circuit configured to receive an input voltage, a secondary-side circuit configured to generate an output voltage using the input voltage, a transformer coupling the primary-side circuit to the secondary-side circuit, a main switch coupled to a primary winding of the transformer and configured to control a current through the primary winding, and a converter controller. The converter controller includes a primary-side controller in signal communication with the main switch, the primary-side controller being configured to control an on time and an off time of the main switch and to detect one or more valleys of a resonant waveform developed at a node of the main switch during the off time of the main switch. The primary-side controller is configured to operate in a valley reduction mode of operation upon determining that the output voltage is less than a reference voltage of the flyback converter minus a predetermined threshold value. The valley reduction mode of operation comprises decrementing, by the primary-side controller, for each switching cycle of the main switch, a number of valleys occurring during that switching cycle of the main switch.

Some embodiments described herein provide a method that involves receiving, at a primary-side circuit of a flyback converter, an input voltage, and generating, at a secondary-side circuit of the flyback converter, an output voltage using the input voltage. A transformer couples the primary-side circuit to the secondary-side circuit. A main switch coupled to a primary winding of the transformer controls a current through the primary winding. A primary-side controller of the flyback converter controls an on time and an off time of the main switch. The primary-side controller detects one or more valleys of a resonant waveform developed at a node of the main switch during the off time of the main switch. The primary-side controller determines that the output voltage is less than a reference voltage of the flyback converter minus a predetermined threshold value. The primary-side controller begins a valley reduction mode of operation based on the determination. The primary-side controller reduces, during the valley reduction mode of operation, a number of valleys occurring at the node of the main switch during one or more switching cycles of two or more switching cycles of the main switch.

Other devices, apparatuses, systems, methods, features, and advantages of the invention will be or will become apparent to one with skill in the art upon examination of the following figures and detailed description. It is intended that all such additional devices, apparatuses, systems, methods, features, and advantages be included within this description, be within the scope of the invention, and be protected by the accompanying claims.

BRIEF DESCRIPTION OF THE DRAWINGS

The disclosure may be better understood by referring to the following figures. In the figures, like reference numerals designate corresponding parts throughout the different views.

DETAILED DESCRIPTION

In the following description, like reference numbers are used to identify like elements. Furthermore, the drawings are intended to illustrate major features of example embodiments in a diagrammatic manner. The drawings are not intended to depict every feature of actual embodiments.

Disclosed is a quasi-resonant flyback converter controller ("converter controller") for use with a flyback converter where the flyback converter has a primary-side circuit, a secondary-side circuit, and an auxiliary-winding circuit. The converter controller includes a primary-side controller, a secondary-side controller, and a digital link. In general, the secondary-side controller receives an output voltage from the output of the secondary-side circuit and a reference voltage (which represents a desired voltage of the flyback converter). The secondary-side controller encodes and transmits a combined encoded data stream of both the output voltage and a reference voltage to the primary-side controller. The primary-side controller decodes the combined encoded data stream and uses the output voltage and the reference voltage to generate a control signal that controls the switching of a primary-side switch ("main switch") of the primary-side circuit. The primary-side controller generates the control signal by comparing the output voltage to the reference voltage. When a sufficiently large difference is detected between the output voltage and the reference voltage (e.g., due to a transition in the load or the reference voltage), the primary-side controller reduces the number of valleys in each switching cycle of the main switch until the output voltage recovers to a desired voltage level. As a result, tight steady-state voltage regulation and optimal power processing efficiency are achieved.

Figure 1:
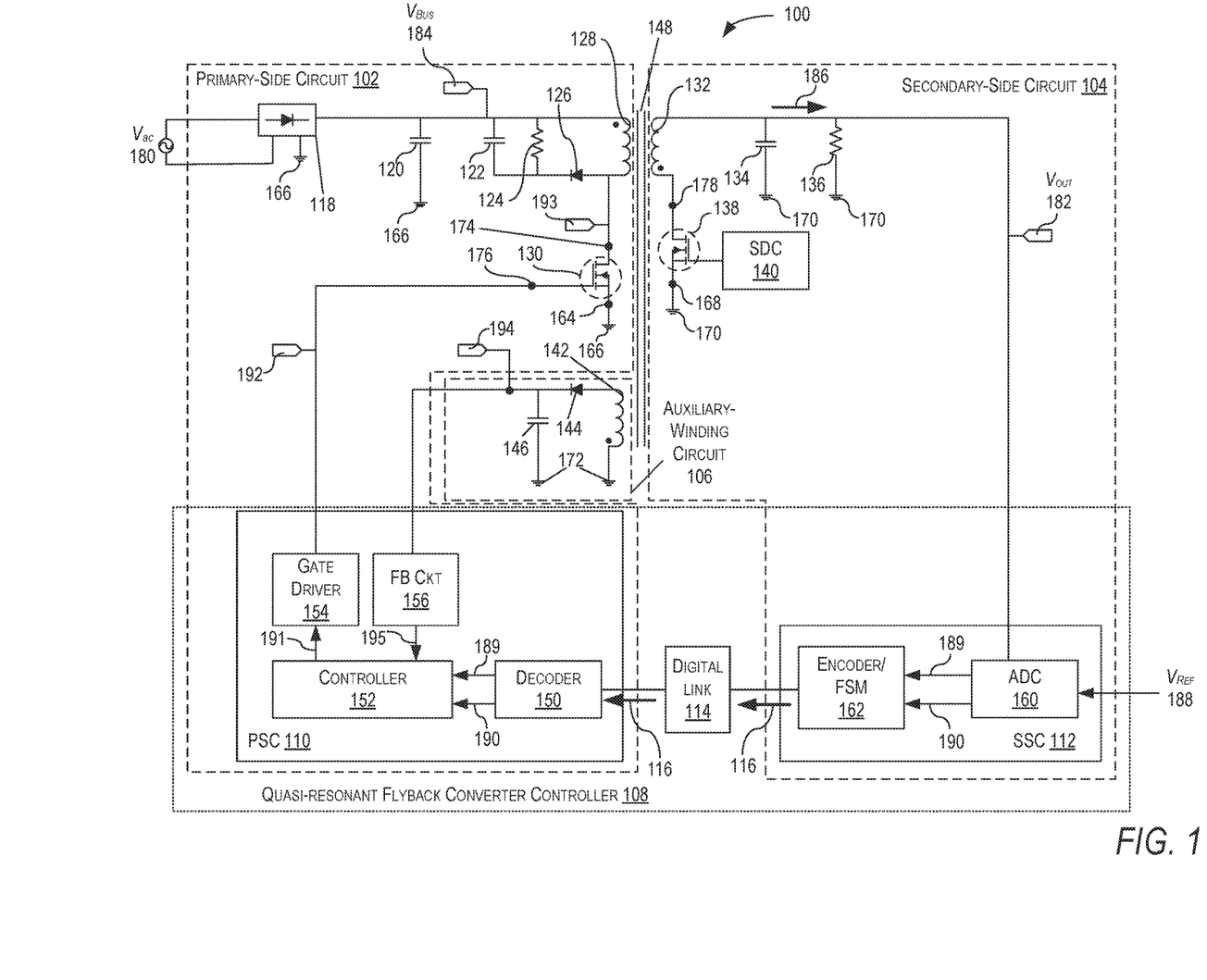
FIG. 1 is a schematic diagram of an example implementation of an alternating current ("AC") to direct current ("DC") flyback converter, in accordance with the present disclosure.

FIG. 1 is a schematic diagram of an example implementation of an alternating current ("AC") to direct current ("DC") flyback converter 100, in accordance with the present disclosure. The flyback converter 100 includes a primary-side circuit 102, a secondary-side circuit 104, an auxiliary-winding circuit 106, and a converter controller 108 ("Quasi-Resonant Flyback Converter Controller"). The converter controller 108 includes a primary-side controller ("PSC") 110, a secondary-side controller ("SSC") 112, and a digital link 114. The primary-side controller 110 is in signal communication with the secondary-side controller 112 via the digital link 114. The digital link 114 may be a unidirectional high-speed digital link that is configured to receive a combined encoded data stream 116 from the secondary-side controller 112 and to transmit the combined encoded data stream 116 to the primary-side controller 110.

In this example, the primary-side circuit 102 includes a rectifier 118, a first capacitor 120, a snubber circuit that includes a second capacitor 122, a first resistor 124, and first diode 126, a primary-winding 128 of a transformer 148, and a main switch 130. The secondary-side circuit 104 includes a third capacitor 134, a second resistor 136, a secondary-side switch ("SR") 138, and a secondary-side driver circuit ("SDC") 140. The auxiliary-winding circuit 106 includes an auxiliary-winding 142 of the transformer 148, a second diode 144, and a fourth capacitor 146. The primary-side controller 110 includes a decoder 150, a controller 152, a gate driver 154, and a feedback circuit ("FB Ckt") component 156. The secondary-side controller 112 includes an analog-to-digital ("ADC") 160 and an encoder 162.

In this example, the rectifier 118, the first capacitor 120, and a source node 164 of the main switch 130 are in signal communication with a primary-side ground 166. The third capacitor 134, the second resistor 136, and a source node 168 of the SR 138 are in signal communication with the secondary-side ground 170. Additionally, the auxiliary-winding 142 and the fourth capacitor 146 are in signal communication with the auxiliary-winding circuit ground 172.

Further, a drain node 174 of the main switch 130 is in signal communication with the primary-winding 128, and a gate node 176 of the main switch 130 is in signal communication with the gate driver 154. A drain node 178 of the SR 138 is in signal communication with the secondary-winding 132. The feedback circuit component 156 is in signal communication with the auxiliary-winding circuit 106 and with the controller 152.

The feedback circuit component 156 provides a signal 195 that is representative of a quasi-resonant waveform developed at the drain node 174 of the main switch 130 during a portion of a switching cycle when the main switch 130 is off. In some embodiments, the feedback circuit component 156 is implemented as an ADC. In other embodiments, the feedback circuit component 156 is implemented as a zero-crossing detection circuit that is operable to emit a pulse each time a valley of the quasi-resonant waveform occurs. In still other embodiments, the feedback circuit component 156 is implemented as a signal slope detection circuit.

It is appreciated by those skilled in the art that the circuits, components, modules, and/or devices of, or associated with, the flyback converter 100 and converter controller 108 are described as being in signal communication with each other, where signal communication refers to any type of communication and/or connection between the circuits, components, modules, and/or devices that allows a circuit, component, module, and/or device to pass and/or receive signals and/or information from another circuit, component, module, and/or device. The communication and/or connection may be along any signal path between the circuits, components, modules, and/or devices that allows signals and/or information to pass from one circuit, component, module, and/or device to another and includes wireless or wired signal paths. The signal paths may be physical, such as, for example, conductive wires, electromagnetic wave guides, cables, attached and/or electromagnetic or mechanically coupled terminals, semi-conductive or dielectric materials or devices, or other similar physical connections or couplings. Additionally, signal paths may be non-physical such as free-space (in the case of electromagnetic propagation) or information paths through digital components where communication information is passed from one circuit, component, module, and/or device to another in varying digital formats without passing through a direct electromagnetic connection.

In an example of operation, the flyback converter 100 converts an AC input voltage ("$V_{ac}$") 180 into a DC output voltage ("$V_{out}$") 182 to power a load (e.g., the second resistor 136). A power source produces the AC input voltage $V_{ac}$ 180 that is rectified by a rectifier 118 to produce an input voltage ("$V_{Bus}$") 184 which is received at the primary-winding 128 of the transformer 148. When the main switch 130 is enabled, the input voltage $V_{Bus}$ 184 produces a current that flows through the primary-winding 128 to charge a magnetizing inductance of the transformer 148. When the main switch 130 is disabled, the magnetizing inductance of the transformer 148 discharges, causing a current 186 to flow from the secondary-winding 132 into the secondary-side circuit 104 to generate the output voltage $V_{out}$ 182 across the second resistor 136 (i.e., the load).

The ADC 160 receives the output voltage $V_{out}$ 182, along with a reference voltage ("$V_{Ref}$") 188. The reference voltage $V_{Ref}$ 188 can be provided by a configuration circuit, by a circuit of the converter controller 108, by a digital-to-analog circuit, by a configurable voltage source, or by another circuit appropriate for generating a reference voltage. In general, the reference voltage $V_{Ref}$ 188 is proportional to, or is indicative of, a desired voltage level of the output voltage $V_{out}$ 182. The ADC 160 converts the output voltage $V_{out}$ 182 and the reference voltage $V_{Ref}$ 188 into a digital output voltage signal ("$V_{out}(n)$") 189 and a digital reference voltage signal ("$V_{Ref}(n)$") 190, respectively. The encoder 162 encodes the digital values (i.e., $V_{out}(n)$ 189 and $V_{Ref}(n)$ 190) into respective encoded digital representations of the output voltage and the reference voltage. In some embodiments, an encoded digital representation is a digital representation that combines two or more streams of digital data into a single stream of digital data. In some embodiments, an encoded digital representation adds additional digital data to one or more digital streams of data, the additional data including one or more of a check sum, a data packet frame, data identifiers, time stamps, and so on. The encoded digital representations are part of a combined encoded data stream 116 that is transmitted to the digital link 114. In this example, the encoder 162 may be implemented as a finite-state machine ("FSM"). The digital link 114 may be implemented as a unidirectional high-speed digital link. The digital link 114 receives the combined encoded data stream 116 and transmits it to the decoder 150.

The decoder 150 converts the combined encoded data stream 116 back into digital voltage values $V_{out}(n)$ 189 and $V_{Ref}(n)$ 190 that are input into the controller 152. The controller 152 controls the gate driver 154 (e.g., using a pulse-width-modulation (PWM) signal) based on a comparison between the digital signals $V_{out}(n)$ 189 and $V_{Ref}(n)$ 190.

The controller 152 supplies a low-voltage PWM signal 191 to the input of the gate driver 154. The gate driver 154 receives the low-voltage PWM signal 191 and produces a higher-voltage PWM main switch 130 driver voltage 192 that is applied to the gate node 176 of the main switch 130 to turn-on (enable) and turn-off (disable) the main switch 130.

The auxiliary-winding circuit 106 is configured to provide the primary-side controller 110 with feedback with regards to the properties of the current flowing through the primary-winding 128 and varying main switch drain-to-source voltage ("$V_{DS}$") 193 at the drain node 174 of the main switch 130. The auxiliary-winding 142 is inductively coupled to the primary-winding 128 and the secondary-winding 132. As such, the auxiliary-winding circuit 106 produces an auxiliary voltage ("$V_{aux}$") 194 across the auxiliary capacitor (i.e., the fourth capacitor 146) that is proportional to the main switch drain-to-source voltage $V_{DS}$ 193 at the drain node 174 of main switch 130. Thus, the quasi-resonant waveform which develops at the drain node 174 of the main switch 130 is present in the auxiliary voltage $V_{aux}$ 194.

In this example, the main switch 130 has at least one switching cycle that is controlled by the PWM signal 191 operating in a steady-state operation (e.g., multi-mode operation). In general, during steady-state operation, the load of the flyback converter 100 is substantially constant, the input voltage $V_{BUS}$ 184 of the flyback converter 100 is substantially constant, and the reference voltage $V_{Ref}$ 188 of the flyback converter 100 is substantially constant. As discussed earlier, the controller 152 receives and compares $V_{out}(n)$ 189 and $V_{Ref}(n)$ 190. If a difference between $V_{out}(n)$ 189 and $V_{Ref}(n)$ 190 is greater than a predetermined threshold value (e.g., 150 mV), for instance, because of a change in the load or in the reference voltage $V_{Ref}(n)$, the controller 152 begins a valley reduction mode of operation. During the valley reduction mode of operation, an off-time of the main switch 130 is adjusted for each switching cycle of the main switch 130 such that a number of valleys of the quasi-resonant waveform is decremented for each switching cycle. That is, during the valley reduction mode of operation, the controller 152 reduces the number of valleys that occur during a switching cycle of the main switch 130 (e.g., during an off time of the main switch 130) as compared to a number of valleys that occurred in a previous switching cycle of the main switch 130. In some embodiments, the controller 152 reduces the number of valleys occurring during a switching cycle of the main switch 130 by one for each switching cycle of the main switch 130.

Figure 2:
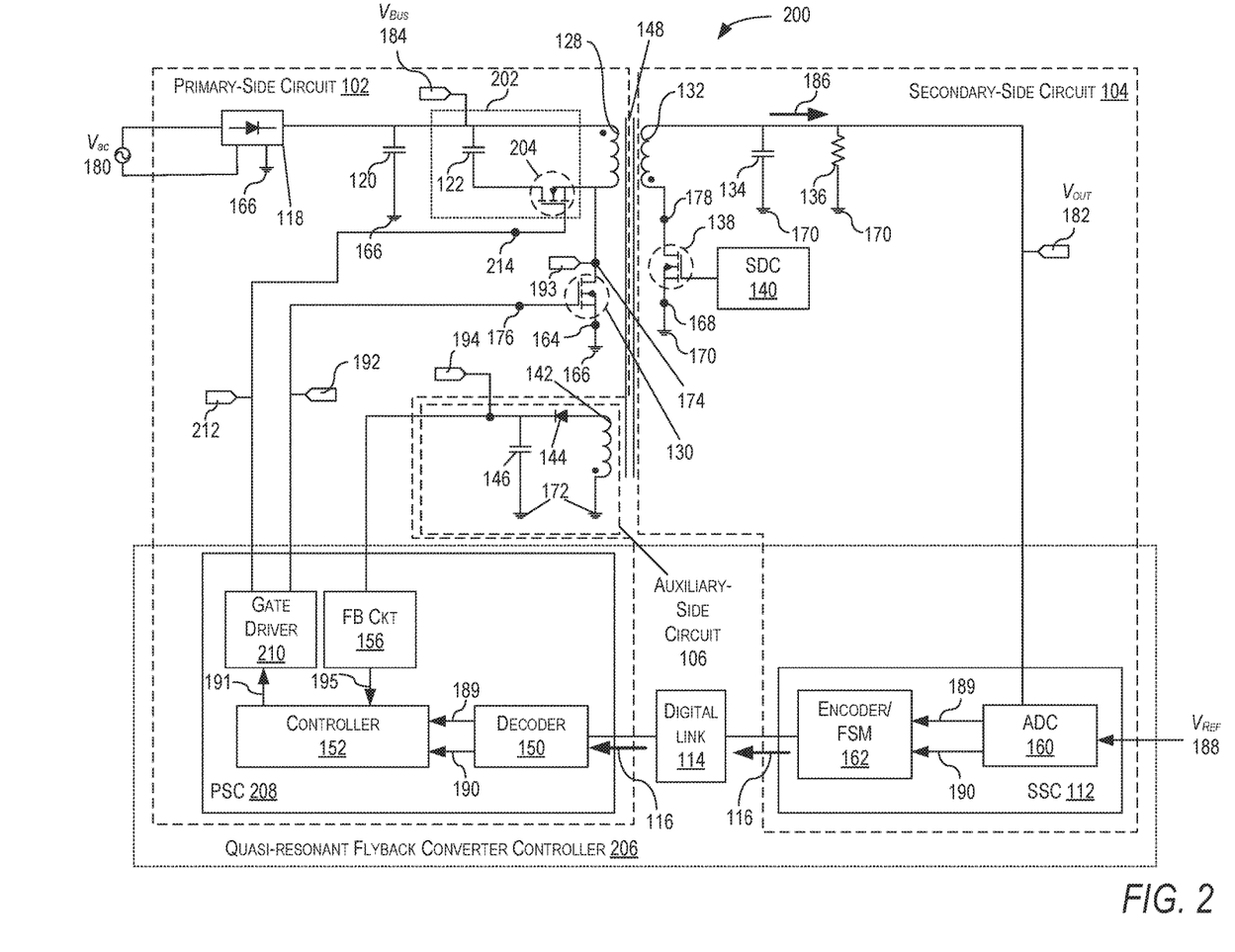
FIG. 2 is a schematic diagram of an example implementation of an AC to DC active-clamp flyback converter, in accordance with the present disclosure.

In FIG. 2, a schematic diagram of an example implementation of an AC-to-DC active-clamp flyback converter 200 is shown in accordance with the present disclosure. This example is similar to the example shown in FIG. 1 with regards to the flyback converter 100, except that in this example the first diode 126 of the snubber circuit is replaced by an active clamp switch 204 of an active clamp circuit 202. Additionally, the first resistor 124 is omitted. In this example, a converter controller ("Quasi-Resonant Flyback Converter Controller") 206, which is similar to the converter controller 108, includes a primary-side controller ("PSC") 208 that includes a gate driver 210 that produces two voltage outputs 192, and 212. The two voltage outputs include the driver voltage 192 that is applied to the gate node 176 of the main switch 130 and a second voltage 212 that is applied to a gate node 214 of the active clamp switch 204 to control the active clamp switch 204.

Figure 3:
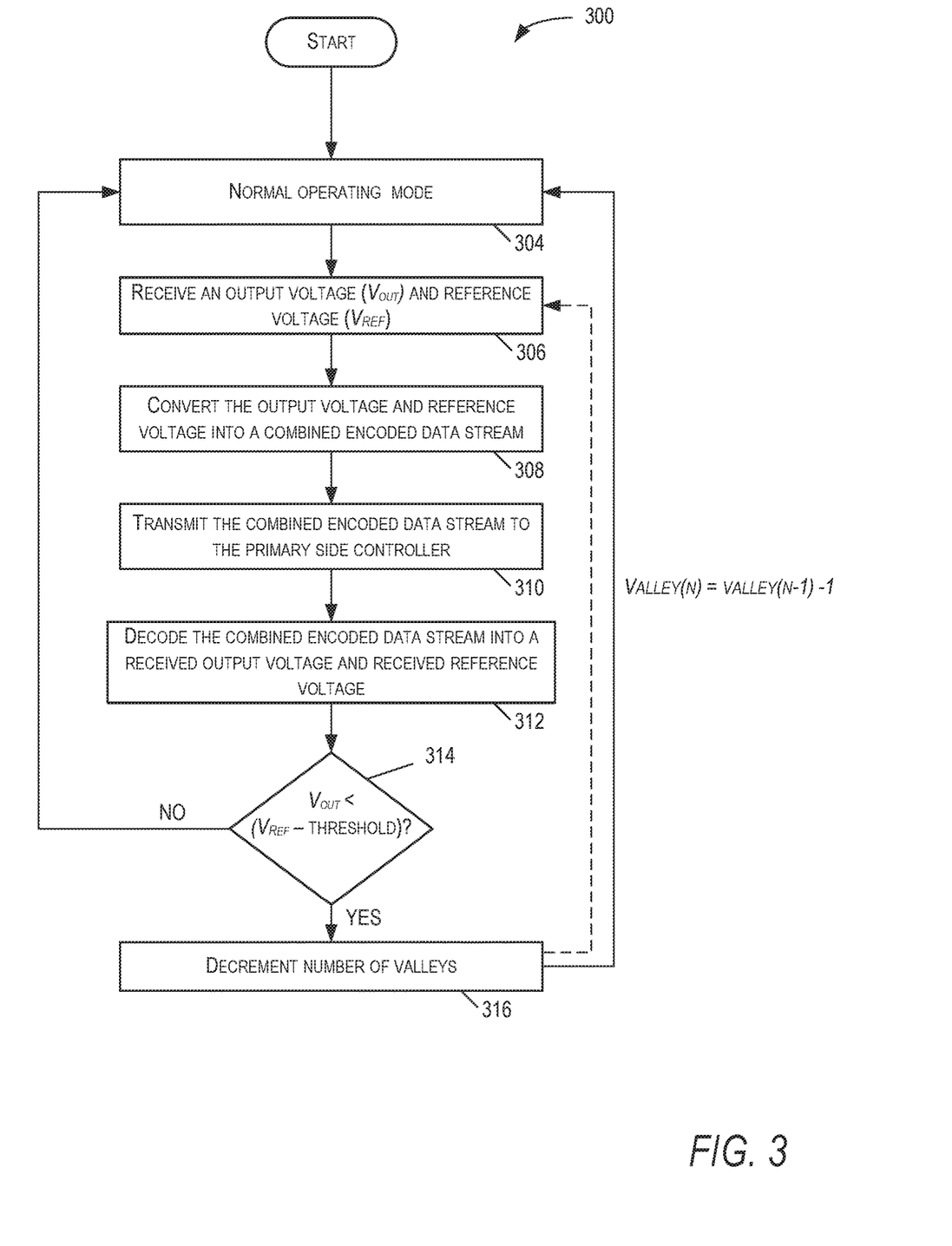
FIG. 3 is a flowchart illustrating a portion of an example method of operation of the flyback converter shown in FIGS. 1 and 2, in accordance with the present disclosure.

FIG. 3 is a flowchart illustrating an example of an implementation of method 300 of operation of the flyback converter 100/200 in accordance with the present disclosure. At step 304, the converter controller 108/206 operates the flyback converter 100/200 in a normal operating mode. In some embodiments, the normal operating mode is a steady-state mode of the flyback converter 100/200. The normal operating mode can include one of several operating modes, such as a burst mode of operation. At step 306, the converter controller 108/206 receives the output voltage $V_{out}$ 182 and the reference voltage $V_{Ref}$ 188. At step 308, the converter controller 108/206 converts the output voltage $V_{out}$ 182 and reference voltage $V_{Ref}$ 188 into the combined encoded data stream 116. At step 310, the combined encoded data stream 116 is transmitted to the primary-side controller 110. At step 312, the encoded data stream 116 is decoded into a received output voltage and a received reference voltage. At step 314, the received output voltage is compared to a difference between the received reference voltage and a predetermined threshold voltage (e.g., 150 mV). If it is determined at step 314 that the received output voltage is less than the reference voltage minus the predetermined threshold voltage (i.e., a difference between $V_{out}(n)$ 189 and $V_{Ref}(n)$ 190 is greater than a predetermined threshold value), flow continues to step 316. At step 316, the number of valleys of the quasi-resonant waveform developed at the drain node 174 of the main switch 130 is decremented for each switching cycle of the main switch 130. In some embodiments, the number of valleys is decremented by one (e.g., valley(n)=valley(n−1)−1). In some embodiments, the number of valleys occurring during the switching cycle of the main switch 130 is decremented by decrementing a target valley number (e.g., valley(n)) used by the converter controller 108/206 to determine an off time of the main switch 130. By adjusting the off time of the main switch 130 to be less than a previous off time of the main switch 130 by a time corresponding to an integer number of valleys, the main switch 130 will thereby be turned on (enabled) at an earlier valley. In some embodiments, after decrementing the number of valleys at step 316, flow returns to step 304. In other embodiments, after decrementing the number of valleys at step 316, flow returns to step 306, as indicated by a dashed line. If instead it is determined at step 314 that the received output voltage is not less than the received reference voltage minus the predetermined threshold voltage, flow returns to step 304.

As discussed earlier, transmitting (at step 310) the combined encoded data stream 116 to the primary-side controller 110 includes transmitting the combined encoded data stream 116 to the primary-side controller 110 through the digital link 114. Moreover, converting (at step 308) the digital output voltage 189 and the digital reference voltage 190 into the combined encoded data stream 116 includes receiving the output voltage $V_{out}$ 182 and the reference voltage $V_{Ref}$ 188 with the ADC 160 that produces the digital output voltage 189 and a digital reference voltage 190 and encoding the digital output voltage 189 and the digital reference voltage 190 into the combined encoded data stream 116.

Figure 4:
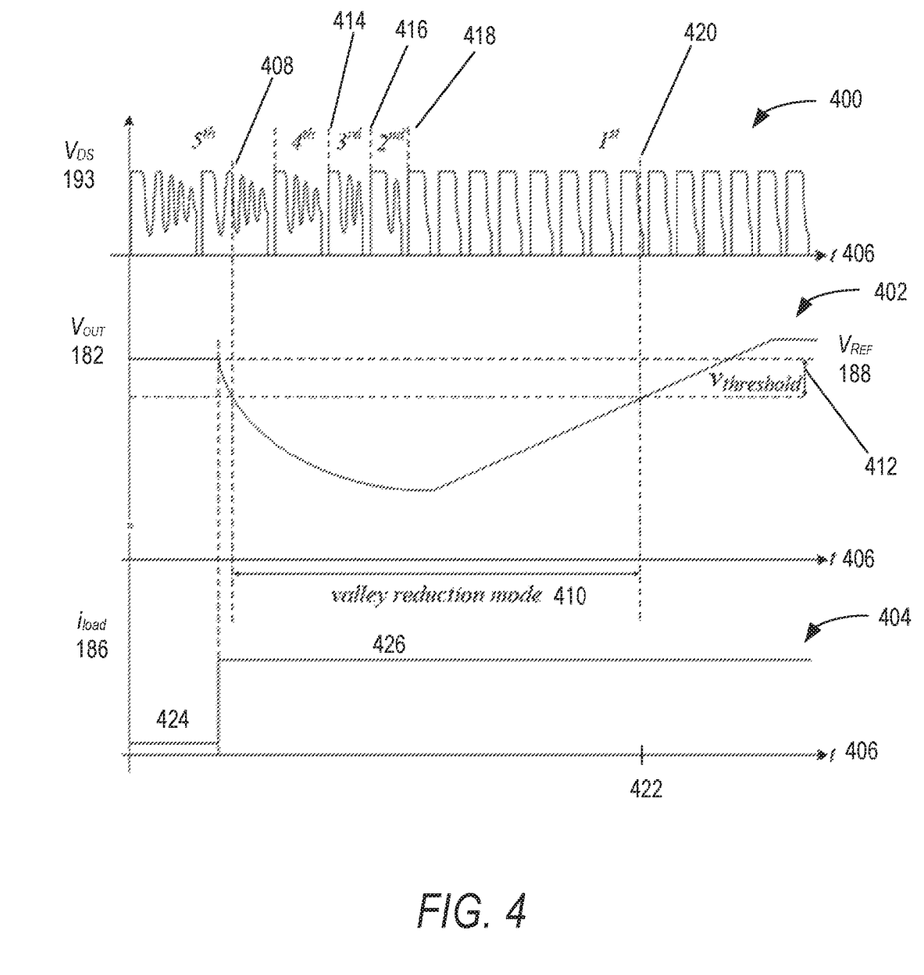
FIG. 4 is a plot of example waveforms of the drain-to-source voltage of the primary-side switch, output voltage and load current shown in FIG. 1 or FIG. 2 during a light-to-heavy load transition of the flyback converter, in accordance with the present disclosure.

FIG. 4 shows plots 400, 402, and 404 of example waveforms of the main switch drain-to-source voltage $V_{DS}$ 193 of the main switch 130, the output voltage $V_{out}$ 182 and the load current ("$i_{load}$") 186 during a light-to-heavy load transition of the flyback converter 100/200 in accordance with the present disclosure. All of the plots 400, 402, and 404 are plotted versus time t 406. In this example, the main switch drain-to-source voltage $V_{DS}$ 193 plot 400 is shown to initially have a switching cycle (e.g., during steady-state operation) during which the main switch 130 is enabled at a fifth valley 408. A disturbance of the load (shown by a step in the load current 186 in the plot 404 from a first level 424 to a second level 426) results in a significant dip in the output voltage $V_{out}$ 182 shown in the plot 402. In response, the converter controller 108 enters into a valley reduction mode 410 because the output voltage $V_{out}$ 182 drops below the reference voltage $V_{Ref}$ 188 by at least the predetermined threshold value $V_{threshold}$ 412 (e.g., 150 mV). Within the valley reduction mode 410, the controller 152 decrements the number of quasi-resonant valleys for each switching cycle of the main switch 130, until the output voltage $V_{out}$ 182 is no longer less than the reference voltage $V_{Ref}$ 188 minus the predetermined threshold value $V_{threshold}$ 412. For example, in the second switching cycle of the main switch 130, the controller 152 causes the main switch 130 to turn on at the fourth valley 414. In the third switching cycle of the main switch 130, the controller 152 causes the main switch 130 to turn on at the third valley 416. In the fourth switching cycle of the main switch 130, the controller 152 causes the main switch 130 to turn on at the second valley 418, and during subsequent switching cycles, the controller 152 causes the main switch 130 to turn on at the first valley 420. After time 422, the output voltage $V_{out}$ 182 recovers and is at least within a window of the reference voltage $V_{Ref}$ 188 by minus the predetermined threshold value 412 so that the converter controller 108 leaves the valley reduction mode 410 and begins to operate in a normal mode of operation.

To elaborate, in the valley reduction mode 410, the controller 152 determines the number of valleys in the off time of the main switch 130 and then reduces the number of valleys occurring during subsequent off times of the main switch 130 during subsequent switching cycles of the main switch 130. As an example, the controller 152 may reduce the off-times of the main switch 130 by reducing the number of valleys by one per switching cycle (e.g., by turning on the main switch 130 when the valley number is one less than the valley number that was cut off in the preceding switching cycle). As another example, for one or more switching cycles of the main switch 130, the controller 152 decrements the number of valleys by one or more (i.e., by 1, 2, 3, 4, etc.). Reducing the number of valleys by one (or more) each switching cycle advantageously enables the flyback converter 100/200 to have faster response time to transients (e.g., such as load transitions) while, at the same time, obtaining the benefits of a quasi-resonant mode of operation.

Figure 5:
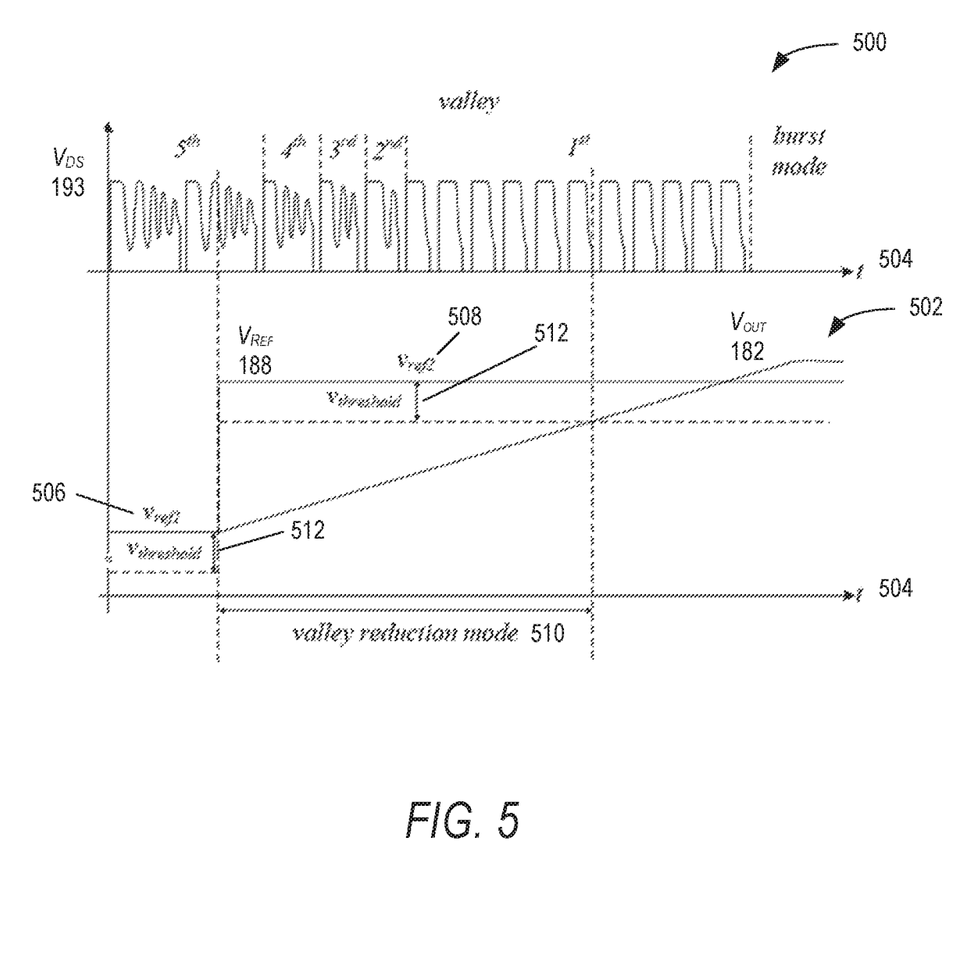
FIG. 5 is a plot of example waveforms of the drain-to-source voltage of the primary-side switch and output voltage shown in FIG. 1 or FIG. 2 during an output voltage reference step change, in accordance with the present disclosure.

FIG. 5 shows plots 500, and 502 of example waveforms of the main switch drain-to-source voltage $V_{DS}$ 193 of the main switch 130 and the output voltage $V_{out}$ 182 during a reference voltage $V_{ref}$ 188 step change, in accordance with the present disclosure. Both of the plots 500 and 502 are plotted versus time 504 and the voltage reference step is from a first level $V_{ref1}$ 506 to a second level $V_{ref2}$ 508. As show, after reference voltage $V_{ref}$ 188 transitions from the first level $V_{ref1}$ 506 to the second level $V_{ref2}$ 508, each switching cycle of the main switch 130 of the flyback converter 100/200 switches at an earlier valley (e.g., $5^{th}$, then $4^{th}$, then $3^{rd}$, and so on) during valley reduction mode 510. At the point where the plot 502 of the output voltage $V_{out}$ 182 surpasses the reference level $V_{ref2}$ 508 minus a predetermined threshold 512 (e.g., 150 mV), the flyback converter 100 exits the valley reduction mode 510 and enters a burst mode of operation.

It will be understood that various aspects or details of the invention may be changed without departing from the scope of the invention. It is not exhaustive and does not limit the claimed inventions to the precise form disclosed. Furthermore, the foregoing description is for the purpose of illustration only, and not for the purpose of limitation. Modifications and variations are possible in light of the above description or may be acquired from practicing the invention. The claims and their equivalents define the scope of the invention.

In some alternative examples of implementations, the function or functions noted in the blocks may occur out of the order noted in the figures. For example, in some cases, two blocks shown in succession may be executed substantially concurrently, or the blocks may sometimes be performed in the reverse order, depending upon the functionality involved. Also, other blocks may be added in addition to the illustrated blocks in a flowchart or block diagram.

The description of the different examples of implementations has been presented for purposes of illustration and description, and is not intended to be exhaustive or limited to the examples in the form disclosed. Many modifications and variations will be apparent to those of ordinary skill in the art. Further, different examples of implementations may provide different features as compared to other desirable examples. The example, or examples, selected are chosen and described in order to best explain the principles of the examples, the practical application, and to enable others of ordinary skill in the art to understand the disclosure for various examples with various modifications as are suited to the particular use contemplated.

Moreover, reference has been made in detail to examples of implementations of the disclosed invention, one or more examples of which have been illustrated in the accompanying figures. Each example has been provided by way of explanation of the present technology, not as a limitation of the present technology. In fact, while the specification has been described in detail with respect to specific examples of implementations of the invention, it will be appreciated that those skilled in the art, upon attaining an understanding of the foregoing, may readily conceive of alterations to, variations of, and equivalents to these examples of implementations. For instance, features illustrated or described as part of one example of an implementation may be used with example of another implementation to yield a still further example of an implementation. Thus, it is intended that the present subject matter covers all such modifications and variations within the scope of the appended claims and their equivalents. These and other modifications and variations to the present invention may be practiced by those of ordinary skill in the art, without departing from the scope of the present invention, which is more particularly set forth in the appended claims. Furthermore, those of ordinary skill in the art will appreciate that the foregoing description is by way of example only, and is not intended to limit the invention.

What is claimed is:

1. A flyback converter comprising:
a primary-side circuit configured to receive an input voltage;
a secondary-side circuit configured to generate an output voltage using the input voltage;
a transformer coupling the primary-side circuit to the secondary-side circuit;
a main switch coupled to a primary winding of the transformer and configured to control a current through the primary winding; and
a converter controller comprising:
a primary-side controller in signal communication with the main switch, the primary-side controller being configured to control an on time and an off time of the main switch and to detect one or more valleys of a resonant waveform developed at a node of the main switch during the off time of the main switch;
wherein:
the primary-side controller is configured to operate in a valley reduction mode of operation upon determining that the output voltage is less than a reference voltage of the flyback converter minus a predetermined threshold value; and
the valley reduction mode of operation comprises decrementing, by the primary-side controller, for each switching cycle of the main switch, a number of valleys occurring during that switching cycle of the main switch.

2. The flyback converter of claim 1, wherein:
the primary-side controller is configured to stop the valley reduction mode of operation upon determining that the output voltage is not less than the reference voltage of the flyback converter minus the predetermined threshold value.

3. The flyback converter of claim 1, wherein:
during the valley reduction mode of operation, the primary-side controller decrements the number of valleys by one or more for each of the switching cycles of the main switch.

4. The flyback converter of claim 3, wherein:
during the valley reduction mode of operation, the primary-side controller decrements the number of valleys occurring during each of the switching cycles of the main switch by adjusting the off time of the main switch for each of the switching cycles.

5. The flyback converter of claim 1, wherein:
the primary-side controller is configured to receive an auxiliary voltage from an auxiliary-winding circuit coupled to the transformer; and
the primary-side controller is configured to detect the number of valleys of the resonant waveform using the auxiliary voltage.

6. The flyback converter of claim 1, further comprising:
a secondary-side controller, in signal communication with the secondary-side circuit; and
a digital link in signal communication with the primary-side controller and the secondary-side controller;

wherein:
the secondary-side controller is configured to receive the output voltage from the secondary-side circuit and the reference voltage, convert the output voltage into a digital output voltage signal and the reference voltage into a digital reference voltage signal, and transmit the digital output voltage signal and the digital reference voltage signal to the digital link;
the digital link is configured to transmit the digital output voltage signal and the digital reference voltage signal to the primary-side controller; and
the primary-side controller is configured to receive the digital output voltage signal and the digital reference voltage signal and determine if the output voltage is less than the reference voltage minus the predetermined threshold value.

7. The flyback converter of claim 6, the secondary-side controller comprising:
an analog-to-digital converter ("ADC") configured to receive the output voltage from the secondary-side circuit and the reference voltage, wherein the ADC is configured to convert the output voltage into the digital output voltage signal and the reference voltage into the digital reference voltage signal; and
an encoder in signal communication with the ADC, wherein the encoder is configured to receive and encode the digital output voltage signal and the digital reference voltage signal into a combined encoded data stream having digital representations of the output voltage and the reference voltage.

8. The flyback converter of claim 7, wherein the encoder is a finite-state machine.

9. The flyback converter of claim 7, the primary-side controller comprising:
a decoder configured to receive and decode the combined encoded data stream into a received digital output voltage signal and received digital reference voltage signal; and
a controller in signal communication with the decoder, wherein the controller is configured to receive the received digital output voltage signal and the received digital reference voltage signal and to control the on time and the off time of the main switch based on the received digital output voltage signal and the received digital reference voltage signal.

10. The flyback converter of claim 6, wherein the digital link is a unidirectional high-speed digital link.

11. A method comprising:
receiving, at a primary-side circuit of a flyback converter, an input voltage;
generating, at a secondary-side circuit of the flyback converter, an output voltage using the input voltage, a transformer coupling the primary-side circuit to the secondary-side circuit;
controlling, using a main switch coupled to a primary winding of the transformer, a current through the primary winding;
controlling, by a primary-side controller of the flyback converter, an on time and an off time of the main switch;
detecting, by the primary-side controller, one or more valleys of a resonant waveform developed at a node of the main switch during the off time of the main switch;
determining, by the primary-side controller, that the output voltage is less than a reference voltage of the flyback converter minus a predetermined threshold value;

beginning, by the primary-side controller, a valley reduction mode of operation based on the determination; and reducing, by the primary-side controller during the valley reduction mode of operation, a number of valleys occurring at the node of the main switch during one or more switching cycles of a plurality of switching cycles of the main switch.

12. The method of claim 11, further comprising:

stopping, by the primary-side controller, the valley reduction mode of operation upon determining that the output voltage is not less than the reference voltage of the flyback converter minus the predetermined threshold value.

13. The method of claim 11, further comprising:

decrementing, by the primary-side controller during the valley reduction mode of operation, the number of valleys occurring during each switching cycle of the plurality of switching cycles of the main switch.

14. The method of claim 13, further comprising:

adjusting, by the primary-side controller during the valley reduction mode of operation, the off time of the main switch by an amount of time corresponding to an integer number of valleys to decrement the number of valleys occurring during each switching cycle of the plurality of switching cycles of the main switch.

15. The method of claim 11, further comprising:

receiving, by the primary-side controller, an auxiliary voltage from an auxiliary-winding circuit coupled to the transformer; and detecting, by the primary-side controller, the number of valleys of the resonant waveform using the auxiliary voltage.

16. The method of claim 11, wherein:

the flyback converter further comprises a secondary-side controller, in signal communication with the secondary-side circuit;

the flyback converter further comprises a digital link in signal communication with the primary-side controller and the secondary-side controller; and the method further comprises:

receiving, by the secondary-side controller, the output voltage from the secondary-side circuit and the reference voltage;

converting, by the secondary-side controller, the output voltage into a digital output voltage signal and the reference voltage into a digital reference voltage signal;

transmitting, by the secondary-side controller, the digital output voltage signal and the digital reference voltage signal to the digital link;

transmitting, by the digital link, the digital output voltage signal and the digital reference voltage signal to the primary-side controller; and receiving, by the primary-side controller, the digital output voltage signal and the digital reference voltage signal, the digital output voltage signal and the digital reference voltage signal being used to determine, by the primary-side controller, that the output voltage is less than the reference voltage of the flyback converter minus the predetermined threshold value.

17. The method of claim 16, wherein:

the secondary-side controller further comprises an analog-to-digital converter ("ADC") and an encoder in signal communication with the ADC; and the method further comprises:

receiving, by the ADC, the output voltage from the secondary-side circuit and the reference voltage;

converting, by the ADC, the output voltage into the digital output voltage signal and the reference voltage into the digital reference voltage signal;

receiving, by the encoder, the digital output voltage signal and the digital reference voltage signal; and encoding, by the encoder, the digital output voltage signal and the digital reference voltage signal into a combined encoded data stream having digital representations of the output voltage and the reference voltage.

18. The method of claim 17, wherein the encoder is a finite-state machine.

19. The method of claim 17, wherein:

the primary-side controller further comprises a decoder and a controller in signal communication with the decoder; and the method further comprises:

receiving, by the decoder, the combined encoded data stream;

decoding, by the decoder, the combined encoded data stream into a received digital output voltage signal and received digital reference voltage signal;

receiving, by the controller, the received digital output voltage signal and the received digital reference voltage signal; and controlling, by the controller, the on time and the off time of the main switch based on the received digital output voltage signal and the received digital reference voltage signal.

20. The method of claim 16, wherein the digital link is a unidirectional high-speed digital link.

\* \* \* \* \*